United States Patent [19]

Degani

[11] Patent Number: 5,904,859
[45] Date of Patent: May 18, 1999

[54] FLIP CHIP METALLIZATION

[75] Inventor: Yinon Degani, Middlesex County, N.J.

[73] Assignee: Lucent Technologies Inc., Murray Hill, N.J.

[21] Appl. No.: 08/825,923

[22] Filed: Apr. 2, 1997

[51] Int. Cl.[6] .................................................. H01B 13/00
[52] U.S. Cl. .............................. 216/18; 216/13; 216/95; 216/105; 216/100; 252/79.5; 438/754
[58] Field of Search ............................. 216/105, 13, 18; 252/79.5; 438/754

[56] References Cited

U.S. PATENT DOCUMENTS

| | | | |
|---|---|---|---|
| 3,809,588 | 5/1974 | Zeblisky | 216/105 |
| 4,396,900 | 8/1983 | Hall | 338/309 |
| 4,434,434 | 2/1984 | Bhattacharya et al. | 357/71 |
| 4,747,907 | 5/1988 | Acocella et al. | 216/105 |
| 5,503,286 | 4/1996 | Nye, III et al. | 216/13 |

Primary Examiner—R. Bruce Breneman
Assistant Examiner—Shamim Ahmed

[57] ABSTRACT

The specification describes techniques for applying under bump metallization (UBM) for solder bump interconnections on interconnection substrates. The UBM of the invention comprises a Cu, Cu/Cr, Cr multilayer structure. Problems in etching the Cu/Cr layer are overcome using a high pH etchant containing a copper complexing ingredient to prevent passivation of the copper constituent by the chromium etchant solution. With the availability of this etchant the UBM multilayer can be formed using subtractive techniques.

11 Claims, 2 Drawing Sheets

FLIP CHIP METALLIZATION

FIELD OF THE INVENTION

This invention relates to electronic assembly technology and more specifically to solder bump interconnections for mounting IC chips and the like on interconnection substrates like silicon, ceramic, or printed circuit boards.

BACKGROUND OF THE INVENTION

Solder bump interconnection techniques for both electrically contacting component packages and mounting them on interconnection substrates such as printed circuit boards has become widely used in the manufacture of electronic devices. Interconnection substrates includes several forms of electronic device supports including, e.g., silicon and ceramic. For convenience reference to such supports herein will be to printed wiring boards as a generic term.

State of the art component packages are small and lightweight and can be surface mounted to printed circuit boards using fine patterns of solder bumps. Typically, bumps or pads are formed on both the printed wiring board and the component package in mirror arrays that mate when the component package is properly placed. Assembly is completed by applying heat to melt the solder and form the solder bond and interconnection. This technique is used in flip-chip technology where the surface of the IC chip in the component package is provided with bonding pads or bumps and the chip is mounted upside down on the printed wiring board.

The solder bumps are formed on arrays of I/O contact pads prior to assembly. To facilitate localized or selective application of solder to the array of contact pads the surface of the pads should be solder wettable. The metal interconnection pattern typically used for integrated circuits boards or cards is aluminum. While techniques for soldering directly to aluminum have been tried it is well known and accepted that aluminum is not a desirable material to solder. Consequently the practice in the industry is to apply a metal coating on the aluminum contact pads, and apply the solder bump or pad to the coating. This coating is referred to as under bump metallization (UBM).

The metal or metals used in UBM technology must adhere well to aluminum, be wettable by typical tin solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. Accordingly it adheres well to dielectric materials, e.g. $SiO_2$, SINCAPS, polyimide, etc., commonly used in IC processing, as well as to metals such as copper and aluminum. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

The aforementioned layers are conventionally sputtered, so several options for depositing them are conveniently available. The layer can be sputtered from an alloy target. It can be sputtered using a chromium target, then changing to a copper target. Or it can be sputtered using separate chromium and copper targets, and transitioning between the two. The latter option produces a layer with a graded composition, and is a preferred technique.

In forming the structure just described the accepted practice is to use an additive process for selective deposition of the composite layer. Additive processes are well known and include lift-off techniques, and the use of shadow masks. Additive processes are used because chromium and copper are not compatible from the standpoint of etch selectivity. It is known that chromium layers readily form an oxide film on exposure to air or water. Chromium oxide is a known refractory material with extreme hardness. To remove this oxide, and etch through the chromium, requires either highly acidic or highly basic etch solutions. Among the known effective etchants for chromium are solutions of hydrated cesium/ammonium sulfate mixed with nitric acid or perchloric acid ($HClO_4$). These etching baths are very acidic, with a pH of 1 or 2, and will etch copper at a rate 10–100 times the rate for chromium. Therefore to clear 2000 Angstroms of chromium requires a copper layer substantially in excess of 2 microns. While it is theoretically possible to deposit a thick copper layer and sacrifice a major part of the layer in order to etch through the chromium containing underlayers, control of the thickness of the final copper layer in such an etch mode is very poor, and edge definition suffers considerably.

Typical of the basic etch solutions for chromium is an aqueous mixture of sodium hydroxide and potassium ferricyanide. This solution has a pH of around 13, and is very selective with respect to copper due to the formation of an insoluble film of copper hydroxide on the copper surface. Because of this extreme etch selectivity, this etchant will not etch the copper/chromium mixed layer that is useful for the integrity of the UBM.

For more details on etch solutions for chromium and copper see e.g. Thin Film Processes, Edited by J. L. Vossen, Academic Press, San Diego, pp. 465–467.

Because of the unfavorable etch selectivity of known acidic chemical etchants for chromium/copper composite structures, and because the known basic solutions will not etch a Cu/Cr layer, the conventional approach in the art is to use an additive process for forming the composite layer. These processes do not require etchants for the metal layers. However, additive processes suffer known deficiencies in comparison with substractive processes, e.g. photolithographic patterning. Prominent among those is lack of edge definition and generally inferior resolution. As the size of IC packages continues to shrink, the pitch of I/O contact arrays decreases, thus increasing the need for selective deposition processes with high definition. Accordingly, solder bump technology with under bump metallization would be advanced substantially by a selective deposition process that uses standard lithographic patterning. Such an advance requires the development of an effective etchant for Cu—Cu/Cr—Cr composite layers.

SUMMARY OF THE INVENTION

I have discovered an etchant solution for etching chromium in the presence of copper with an etch selectivity that essentially preserves the copper layer, while etching through a substantial thickness of chromium or chromium/copper. The solution according to the invention is a basic ferricyanide solution with a high pH, and includes a copper complexing ingredient to prevent passivation of copper by insoluble hydroxide while etching the mixed Cu/Cr layer.

DETAILED DESCRIPTION

Figure 1:
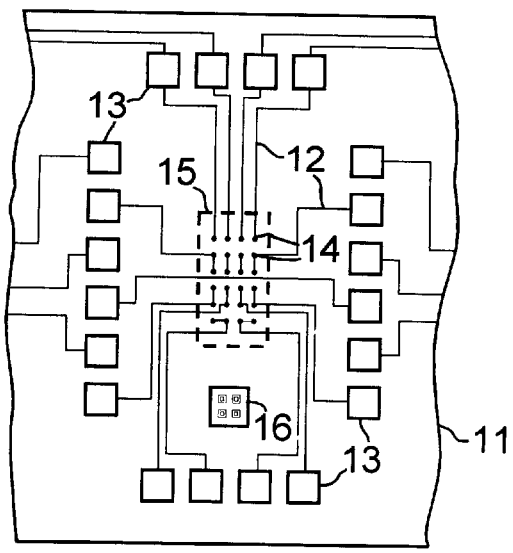
FIG. 1 is a schematic diagram of printed circuit board adapted for flip-chip bonding of a component package to an array of solder bump contacts on the board and/or the flip-chip.

Referring to FIG. 1, a cutaway portion of a printed circuit board 11 is shown with a printed circuit of runners 12 interconnecting the outer arrays of I/O contact pads 13 with a 4×6 array of solder bumps 14. The Figure shows a site 15, in phantom, for a flip-chip component to be installed. The entire board may contain several or many flip-chip sites depending on the size of the assembly and the size of the various elements. In the embodiment shown in FIG. 1 the outline of the flip-chip package 15 is approximately 4×7 mm and the 4×6 array of solder bumps 14 is slightly smaller. A capacitor is shown at 16. The printed circuit of FIG. 1 is for a single in-line memory module (SIMM), but the technology in general, and the invention, potentially covers a wide variety of solder mounted devices, and applies to other interconnecting substrates as indicated earlier.

Figure 2:
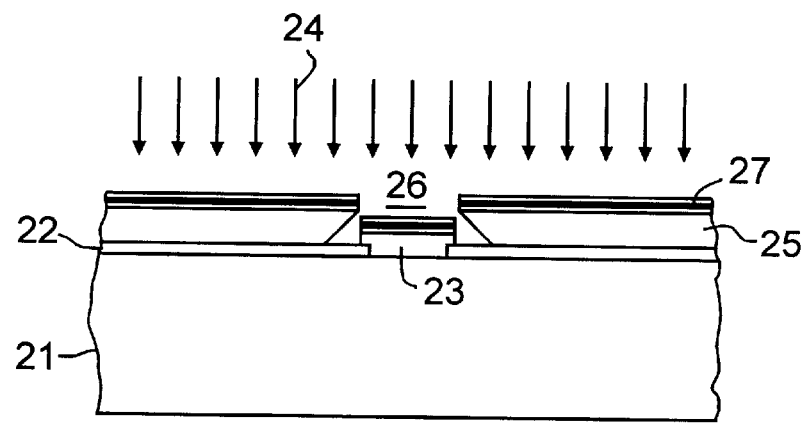
FIG. 2 is a schematic representation of a prior art additive process for forming solder bumps on a semiconductor flip-chip.

FIG. 2 is a schematic representation of an additive process for forming under bump metallization patterns for solder interconnects. It will be understood by those skilled in the art that solder bumps or pads may be applied to the printed circuit board on which the component packages are mounted, and/or to the component packages themselves. FIG. 2 illustrates the deposition of UBM on an IC substrate but would also be representative of a process applied to other kinds of interconnecting substrates. Referring again to FIG. 2 the substrate 21 is shown with oxide layer 22 and an aluminum contact 23 formed in a window of the oxide layer. The contact may be an interlevel metal interconnection or a substrate, e.g. source drain window, contact. Details of the underlying semiconductor structure are not shown and are not critical to the invention. The objective is to cover the surface of the aluminum contact 23 with a coating, ball grid array, or bump, of solder. Accordingly the UBM 27 is applied selectively using a lift-off mask 25 with an opening 26 formed above the contact area. The lift-off mask is typically a photodefinable polymer, such as a triazine-based acrylate, or simply a standard photoresist material. The UBM composite layered structure is formed by evaporating or sputtering multiple layers in the sequence described above. The metal being deposited is indicated by arrows 24. Sputtering is generally preferred for this step since the metal atoms are incident on the substrate with some directionality due to the charge on the substrate. After deposition of the UBM layers, the lift-off mask is removed by dissolving in a suitable solvent or developer, thereby leaving the multilayer deposit on the aluminum contact.

A drawback to this technique is due to the fact that the thickness of the shadow mask or lift-off mask 25 must exceed the thickness of the UBM by a substantial margin to allow removal of the mask after metal deposition. Since the multilayer UBM is typically of the order of 0.5 to 1.0 microns, the mask 25 is relatively thick. The metal atoms being deposited are not all incident normal to the substrate surface, even if they are sputtered, and they diffuse from the intended deposition site. Thus this technique does not produce good edge definition for the UBM. Furthermore, some photoresist materials are laminated into the surface, and the lamination can result in breaking silicon wafers.

Figure 3:
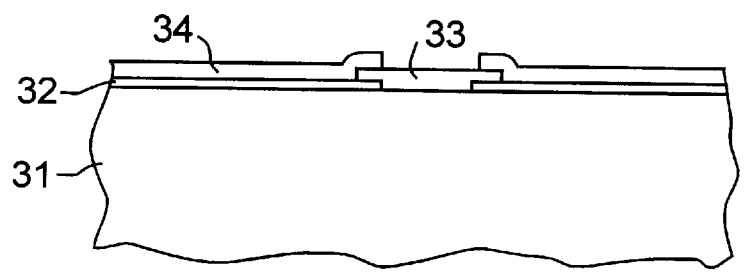
FIGS. 3–6 are schematic representations of steps used in one embodiment to form solder interconnections according to the invention.

According to the invention a substractive, i.e. standard photolithographic process, is used to deposit the UBM. This process is described in connection with FIGS. 3–6. In FIG. 3 a portion of the substrate is shown at 31, with field oxide shown at 32 and aluminum contact at 33. A capping layer of polyimide, or SINCAPS, is shown at 34.

Figure 4:
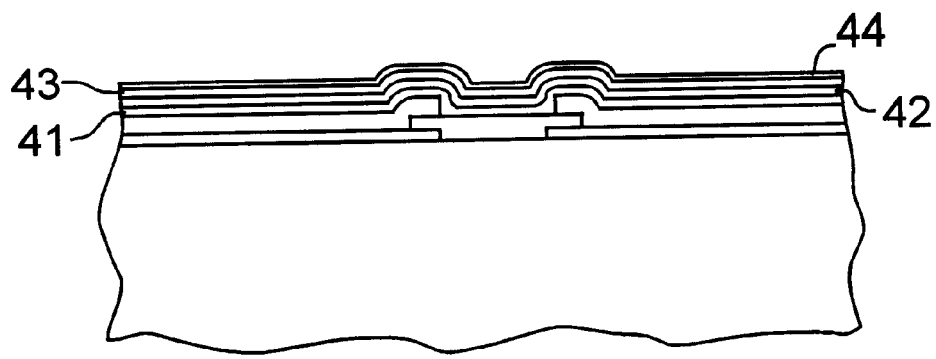

The multilayers for the UBM are deposited sequentially to form the composite layered structure as shown in FIG. 4. In the preferred embodiment, the layers are sputtered in a sputtering apparatus containing both a chromium target and a copper target. Sputtering techniques are well known and the details are not necessary for this description. Other techniques for depositing the metal layers, e.g. evaporation, can also be used.

The first layer 41 is chromium with a thickness of the order of 500–5000 Angstroms and preferably 1000–3000 Angstroms. Chromium adheres well to the aluminum contact 33 and also adheres to the dielectric layers present in the structure. It also is refractory and forms a corrosion resistant interface with the aluminum contact. The second layer 42 is a thin transition layer of Cr/Cu to provide a solder wettable and a metallurgically sound interface between the chromium layer and the subsequently formed copper layer. Layer 42 is preferably formed by sputtering in an apparatus with both chromium and copper targets, and transitioning between the targets. This results in a co-sputtered layer with a composition varying between pure chromium and pure copper. The thickness of the transition layer is of the order of 1000–5000 Angstroms, and preferably 2000–3000 Angstroms.

The next layer 43 is a copper layer with a thickness of the order of 1000–10000 Angstroms, and preferably 2000–6000 Angstroms. The copper layer 43 is wettable with solder materials commonly used for the solder bumps. The melting point of most copper eutectics with tin solders is relatively low, and at the soldering temperature the surface of the copper layer dissolves in the solder bump forming a physically and electrically sound bond. Even if all the copper dissolves into the solder layer the solder will still adhere and wet the Cr/Cu layer.

FIG. 4 shows an optional layer 44 of gold that may be applied to the surface of the copper layer to inhibit oxidation of the copper surface. The optional gold layer has a thickness of 500–3000 Angstroms, and preferably 1000–2000 Angstroms.

Figure 5:
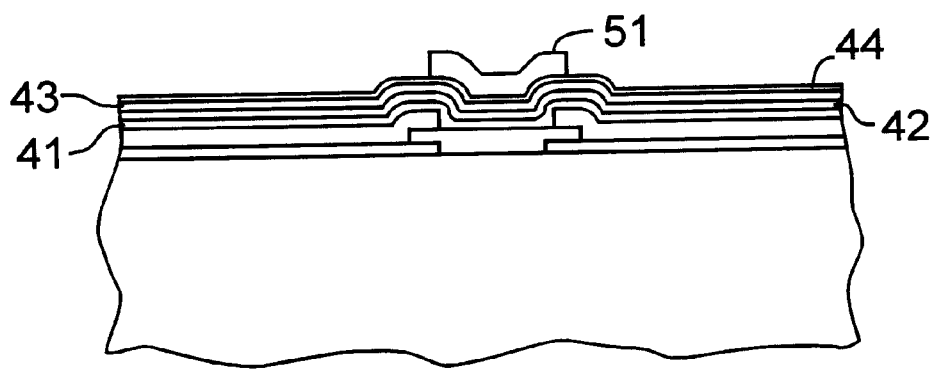

As shown in FIG. 5 an etch mask 51 is applied to mask the solder bump area. The etch mask is preferably a conventional photoresist and is formed by spinning photoresist on the surface layer and patterning the photoresist with suitable actinic radiation. FIG. 5 shows the developed photomask at 51. Alternative masking techniques can be used such as e.g. an oxide hardmask.

With the photomask in place the gold layer 44, if present, and the copper layer 43 are etched using conventional etchant solutions. Gold etchants include potassium cyanide/ferricyanide solutions, iodide/iodine solutions, and aqua regia. Copper is etched with, e.g., iron chloride, or a mixture of sulfuric acid and potassium chromate.

The etch step that forms an important feature of this invention is etching the copper/chromium layer 42 and the chromium layer 41 without severe damage to the overlying copper layer. According to the invention a basic chromium etch solution of sodium hydroxide and potassium ferricyanide is used. This high pH etch solution would normally form an insoluble film of copper hydroxide on the surface regions of the layer 42 being etched, which would passivate layer 42 to further etching. According to the invention a copper complexing agent such as ammonium hydroxide is added to the etchant. This additive complexes with the copper at the surface of layer 42, and as copper is exposed during etching the complexing agent continues to prevent formation of the passivating hydroxide.

The following example is given to demonstrate the effectiveness of the invention.

EXAMPLE

A solution of 20 gr. sodium hydroxide, 60 gr potassium ferricyanide, 30 gr ammonium hydroxide (30% solution in water), and 220 gr of water is made by mixing the ingredients in a beaker until the solids dissolve. The solution has a pH of the order of 13. This solution was found to etch layers 42 and 41 in the structure shown in FIG. 5, i.e. the Cr layer and the Cr/Cu layer, in the presence of copper layer 43, at a rate of approximately 1500 Angstroms per minute without undercutting of the copper overlayer.

The ingredients and the proportions of the ingredients in the above example can varied within reasonable limits and still obtain the benefits of the invention. The essential aspect of the invention can be defined as etching a Cr/Cu layer with an etch solution having a high pH, i.e. greater than 11, and containing a copper complexing ingredient to prevent the formation of passivating copper hydroxide. The copper complexing ingredient can be chosen from known copper complexing or chelating agents. The preferred additive is ammonium hydroxide. Alternative choices would include (among others): ethylenediaminetetraacetic acid (EDTA), N,N'-(disalicylidene)-1,2-propanediamine (DSPDA), citric acid, phosphoric acid, and acetylacetonate.

The sodium hydroxide in the etch solution insures a high pH. Other hydroxides such as potassium hydroxide can be used. If ammonium hydroxide is used as the copper complexing ingredient a suitably high pH for the solution may be obtainable with smaller additions of sodium hydroxide, or the sodium hydroxide may be omitted altogether. The ferricyanide ingredient, $K_3[Fe(CN)_6]$, should be present in a substantial, i.e. effective, amount. Expressing the solution in terms of weight percent an effective amount of the ingredients would lie in the approximate ranges:

alkali ferricyanide: 6–30% alkali hydroxide: 2–12% ammonium hydroxide: 1–6%

These ranges are the best estimates available based on this development work. Those skilled in the art may find other proportions and other active ingredients that reach equivalent results. The vitalizing feature of the invention is the inclusion in the etchant solution of a copper complexing ingredient to inhibit the formation of insoluble copper hydroxide.

Figure 6:
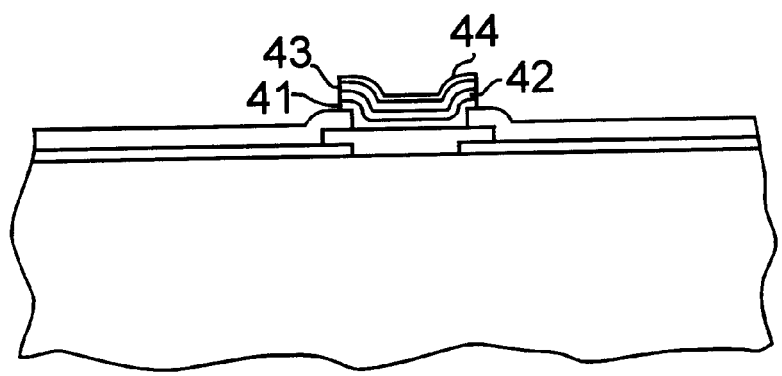

The structure, after etching the multilayer UBM, is shown in FIG. 6. The solder coating over the UBM layer is formed by any suitable technique such as evaporation. The thickness of a typical solder bump for this application is 10–20 mils. Examples of solder compositions that can be used successfully in the processes described above are:

|    | I  | II | III |
|----|----|----|----|
| Sn | 5  | 63 | 95 |
| Pb | 95 | 37 | 0  |
| Sb | 0  | 0  | 5  |

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for etching a layer comprising chromium and copper comprising the step of applying an etchant solution to said layer, said etchant solution having a pH of at least 11, and comprising an alkali ferricyanide to etch the copper and chromium, the invention characterized in that the etchant solution contains a copper complexing agent for inhibiting the formation of copper hydroxide.

2. A method for the manufacture of integrated circuit assemblies wherein the assembly comprises at least one substrate that contains a plurality of aluminum contact pads the method comprising the steps of:

a. depositing a first layer of chromium on said aluminum contact pads, b. depositing a second layer consisting essentially of chromium and copper on said chromium layer, c. depositing a third layer of copper on said chromium and copper layer, d. forming a photomask on selected portions of said third layer, e. etching selected portions of said third layer using said photomask as an etch mask, f. etching portions of said second and first layers exposed by step e. by applying to said portions an etch solution comprising an effective amount of: alkali hydroxide, alkali ferricyanide and a copper complexing agent.

3. The method of claim 2 in which the copper complexing agent is selected from the group consisting of ammonium hydroxide, ethylenediaminetetraacetic acid (EDTA), N,N'-(disalicylidene)-1,2-propanediamine (DSPDA), citric acid, phosphoric acid, and acetylacetonate.

4. The method of claim 3 in which the copper complexing agent is ammonium hydroxide.

5. The method of claim 2 in which the etchant solution comprises approximately 6–30% alkali ferricyanide, 2–12% alkali hydroxide and 1–6% copper complexing agent.

6. The method of claim 2 in which the first layer has a thickness in the range 500–5000 Angstroms, the second layer has a thickness in the range 100–500 Angstroms, and the third layer has a thickness in the range 1000–10000 Angstroms.

7. The method of claim 2 in which the first layer has a thickness in the range 1000–3000 Angstroms, the second layer has a thickness in the range 200–300 Angstroms, and the third layer has a thickness in the range 2000–6000 Angstroms.

8. The method of claim 2 further including the step of depositing a fourth layer of gold over said third layer.

9. The method of claim 1 wherein the substrate is an integrated circuit chip.

10. The method of claim 1 wherein the substrate is an interconnection substrate.

11. A method for the manufacture of integrated circuit assemblies wherein the assembly comprises at least one substrate that contains a plurality of aluminum contact pads the method comprising the steps of:

a. depositing a first layer of chromium on said aluminum contact pads, said first layer having a thickness in the range 500–5000 Angstroms, b. depositing a second layer consisting essentially of chromium and copper on said chromium layer, said second layer having a thickness in the range 100–500 Angstroms, c. depositing a third layer of copper on said chromium and copper layer, said third layer having a thickness in the range 1000–10000 Angstroms, d. forming a photomask on selected portions of said third layer, e. etching selected portions of said third layer using said photomask as an etch mask, f. etching portions of said second and first layers exposed by step e. by applying to said portions an etch solution comprising 2–12% alkali hydroxide, 6–30% alkali ferricyanide and 1–6% of a copper complexing agent selected from the group consisting of ammonium hydroxide, ethylenediaminetetraacetic acid (EDTA), N,N"-(disalicylidene)-1,2-propanediamine (DSPDA), citric acid, phosphoric acid, and acetylacetonate.

* * * * *